(12) United States Patent
Cisneros et al.

(10) Patent No.: US 7,601,559 B2
(45) Date of Patent: Oct. 13, 2009

(54) APPARATUS AND METHOD FOR IDENTIFYING PROPER ORIENTATION AND ELECTRICAL CONDUCTIVITY BETWEEN A SEMICONDUCTOR DEVICE AND A SOCKET OR CONTACTOR

(75) Inventors: Carlos E. Cisneros, Sugar Land, TX (US); James L. Barnett, Missouri City, TX (US); Charles R. Engle, Missouri City, TX (US); Maria D. Evans, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/002,239

(22) Filed: Dec. 14, 2007

(65) Prior Publication Data

US 2008/0218174 A1 Sep. 11, 2008

Related U.S. Application Data

(60) Provisional application No. 60/897,313, filed on Jan. 25, 2007.

(51) Int. Cl.
*H01L 21/66* (2006.01)
*G01R 31/26* (2006.01)
*H01L 21/00* (2006.01)
*H01L 21/44* (2006.01)

(52) U.S. Cl. .................. 438/106; 438/14; 438/15; 438/16; 438/17; 438/18; 438/51; 438/55; 438/64; 438/107; 438/612; 257/E21.499; 257/E21.5; 257/E21.505; 257/E21.512

(58) Field of Classification Search .......... 257/E21.499, 257/E21.5, E21.505, E21.512
See application file for complete search history.

(56) References Cited

U.S. PATENT DOCUMENTS

| | | | |
|---|---|---|---|
| 7,268,571 B1 * | 9/2007 | Korson et al. | 324/763 |
| 7,465,609 B2 * | 12/2008 | Murakami et al. | 438/107 |
| 2003/0038366 A1 * | 2/2003 | Kozono | 257/723 |
| 2008/0061803 A1 * | 3/2008 | Lane | 324/715 |

* cited by examiner

*Primary Examiner*—Savitri Mulpuri
*Assistant Examiner*—Mohsen Ahmadi
(74) *Attorney, Agent, or Firm*—Mima G. Abyad; Wade J. Brady, III; Frederick J. Telecky, Jr.

(57) ABSTRACT

A semiconductor device with a semiconductor die thereon and a contactor board are electrically coupled when the electrically conductive elements on the semiconductor device and the contactor board are in physical contact. A continuous electrically conductive path is formed with electrically conductive elements involving both the semiconductor device and the contactor board. A complete electrical circuit involving both the semiconductor device and the contactor board is formed only when the relative orientation of the semiconductor device and the contactor board have predetermined relationship and the electrically conductive elements of the two boards are in good physical contact.

11 Claims, 17 Drawing Sheets

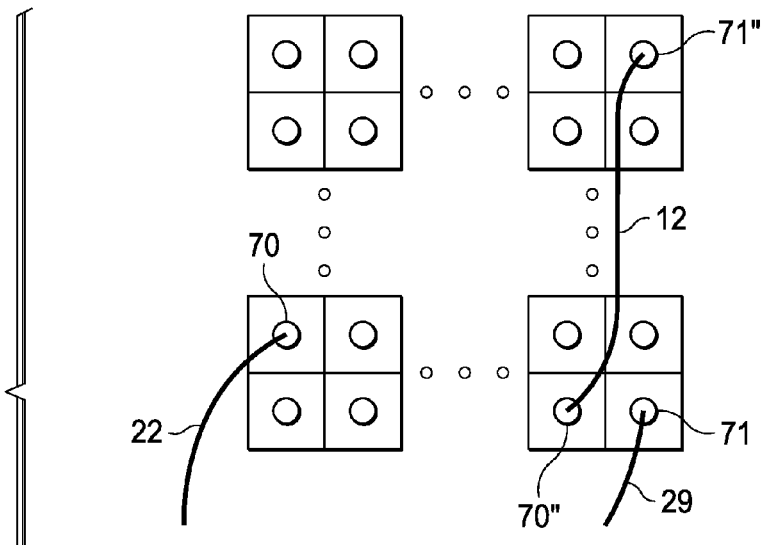

FIG. 3B

COUNTERCLOCKWISE 90 DEGREES

| CONTACTOR BOARD | → | 70, 71 |
| SEMICONDUCTOR DEVICE | → | 12, 70", 71" |
| EXTERNAL LEADS | → | 22, 70, 29, 71 |

**CONTACTOR BOARD ELECTRICALLY CONDUCTIVE: PATH, ELEMENT,
SEMICONDUCTOR DEVICE ELECTRICALLY CONDUCTIVE: PATH, ELEMENT**

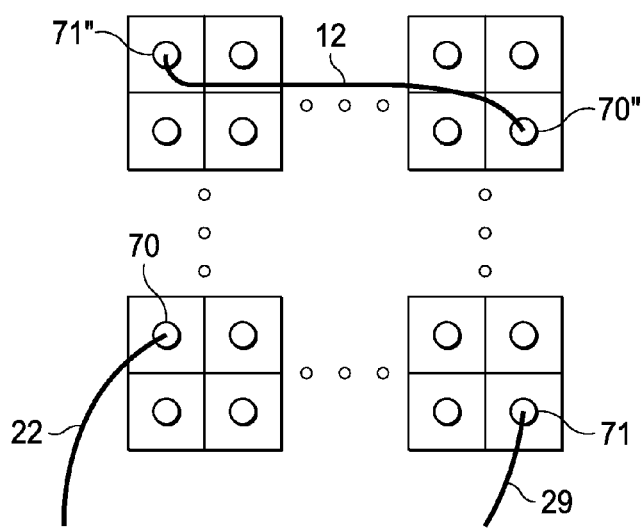

FIG. 3C

COUNTERCLOCKWISE 180 DEGREES

| CONTACTOR BOARD | → | 70, 71 |
| SEMICONDUCTOR DEVICE | → | 12, 70", 71" |
| EXTERNAL LEADS | → | 22, 70, 29, 71 |

**CONTACTOR BOARD ELECTRICALLY CONDUCTIVE: PATH, ELEMENT,
SEMICONDUCTOR DEVICE ELECTRICALLY CONDUCTIVE: PATH, ELEMENT**

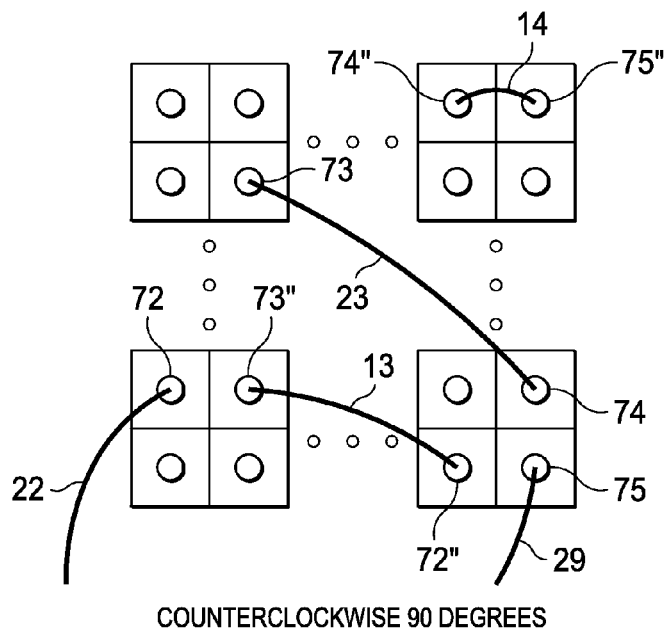

FIG. 4B

COUNTERCLOCKWISE 90 DEGREES

CONTACTOR BOARD → 23, 73, 74,
SEMICONDUCTOR DEVICE → 13, 72", 73", 14, 74", 75"
EXTERNAL LEADS → 22, 72, 29, 75
CONTACTOR BOARD ELECTRICALLY CONDUCTIVE: PATH, ELEMENT,
SEMICONDUCTOR DEVICE ELECTRICALLY CONDUCTIVE: PATH, ELEMENT

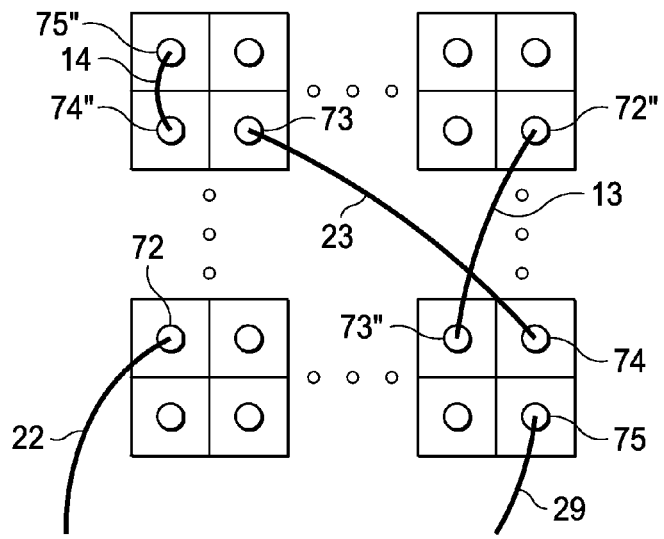

FIG. 4C

COUNTERCLOCKWISE 180 DEGREES

CONTACTOR BOARD → 23, 73, 74,
SEMICONDUCTOR DEVICE → 13, 72", 73", 14, 74", 75"
EXTERNAL LEADS → 22, 72, 29, 75
CONTACTOR BOARD ELECTRICALLY CONDUCTIVE: PATH, ELEMENT,
SEMICONDUCTOR DEVICE ELECTRICALLY CONDUCTIVE: PATH, ELEMENT

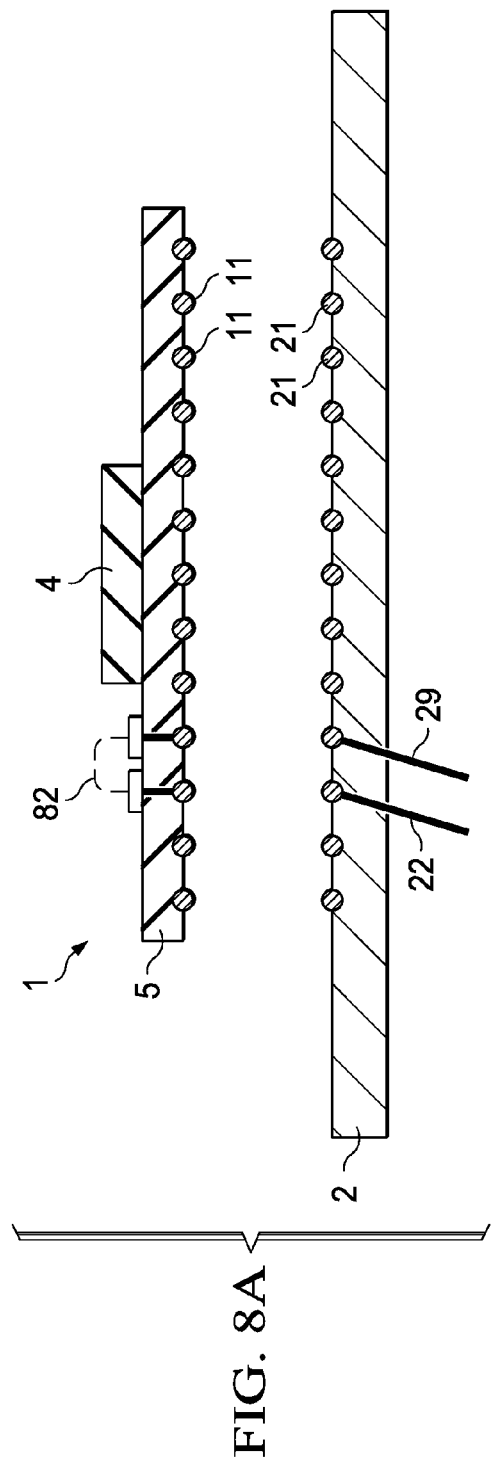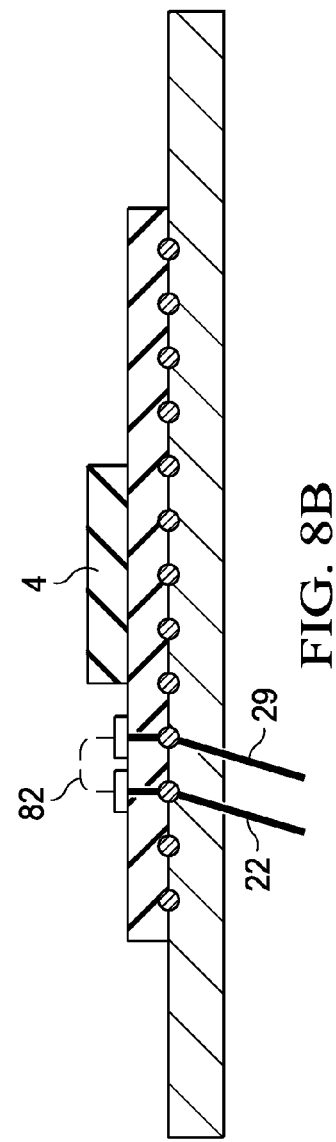
FIG. 8A
FIG. 8B

APPARATUS AND METHOD FOR IDENTIFYING PROPER ORIENTATION AND ELECTRICAL CONDUCTIVITY BETWEEN A SEMICONDUCTOR DEVICE AND A SOCKET OR CONTACTOR

This application claims priority under 35 USC §119(e)(1) of Provisional Application No. 60/897,313 (TI-60762), filed Jan. 25, 2007.

BACKGROUND OF THE INVENTION

1. Field of the Invention

This invention relates generally to the testing of semiconductor devices, and typically to a packaged semiconductor device, which may comprise a semiconductor die and a chip carrier such as a package substrate or tape. The semiconductor device may be mounted to or inserted onto a contactor board, which may be a socket or contactor used for testing the functionality or reliability of the semiconductor device. Due to the possibility of improper seating, misalignment or improper orientation of the semiconductor device relative to the contactor board, proper electrical coupling between the semiconductor device and the contactor board should be verified upon mounting of the semiconductor device onto the contactor board.

Areas of interest are electrical and/or reliability testing of the semiconductor device, or performing any test or qualification that involves a semiconductor device mounted to or inserted onto a contactor board.

2. Description of the Related Art

During the testing of a semiconductor device, it is necessary that a semiconductor device and a contactor board have the proper physical contact between an array of electrically conductive elements, or electrically conductive elements, on an exposed face of the semiconductor device and a facing array of electrically conductive elements on the contactor board. The proper physical contact implies that the semiconductor device and the contactor board have a predetermined relative orientation such that the two arrays of electrically conductive elements are in the correct relative position to complete the requisite electrical circuit for testing the semiconductor device.

In addition, a problem can be that a portion of the electrically conductive elements of the two arrays may be in proper contact, but the remainder of the electrically conductive elements may register an open circuit. The condition can exist when the semiconductor device is tilted with respect to the contactor board such that only a portion of the two arrays are in physical contact. In this configuration, only a portion of the two arrays will have the requisite electrical contact. As a result, the reason for which the semiconductor device and contactor board are electrically coupled is compromised. Further, powering up or applying an electrical current through an improperly coupled semiconductor device and contactor board may electrically and/or mechanically damage the semiconductor device. This damage may be obvious, resulting in a financial loss, or marginal, resulting in the danger that a marginally damaged semiconductor device of lower reliability is delivered to a customer.

Referring to FIG. 1A through FIG. 1C, the physical contact and non-contact of an array of electrically conductive elements 110 located on a semiconductor device 100 with an array of electrically conductive elements 210 of a contactor board 200 is illustrated. In FIG. 1A, the proper alignment of the contactor board 200 and the semiconductor device 100 is illustrated. In this relative positioning, substantially all of the electrically conductive elements 110 of the semiconductor device 100 are in contact with the electrically conductive elements (not shown) on contactor board 200. In FIG. 1B, the semiconductor device 100 is not in correct physical contact with the contactor board 200. Consequently, only the electrically conductive elements 110 along the edge of the semiconductor device 100 may be in contact with the electrically conductive elements 210 on contactor board 200. FIG. 1C illustrates a different positioning problem wherein only an edge row of electrically conductive elements 110 of the semiconductor device 100 may be in contact with the electrically conductive elements 210 of the contactor board 200. As will be clear, when the array of electrically conductive elements 110 between the semiconductor device 1 and contactor board 200 are not in physical and electrical contact, then the electrical conductivity between the semiconductor device 100 and the contactor board 200 may not present.

Referring to FIG. 2, a cross-section view is shown of the contactor board 200 comprising an associated array of electrically conductive elements 210 and a semiconductor device 100 comprising an array of electrically conductive elements 110 is shown. A semiconductor die 400 is shown located within the semiconductor device 100 and may be mounted on the chip carrier 500.

When the semiconductor device 100 and the contactor board 200 are placed in physical contact, at least two problems may occur. The first problem, illustrated on FIG. 1A through FIG. 6D, may present itself because the array of electrically conductive elements 110 and 210 are typically a square array, and therefore, the orientation of the semiconductor device 100 relative to the contactor board 200 may easily be in error, as the semiconductor device 100 and contactor board 200 may be rotated relative to one another. If this erroneous relative rotation occurs, at least a portion of the electrically conductive elements 110 from the semiconductor device 100 and at least a portion of the electrically conductive elements 210 of the contactor board 200 may be in physical contact. However, if the electrically conductive elements 110 and 210 are not in physical and electrical contact in the expected orientation, then the application of an improper voltage will not only result in the spurious operation, but the application of incorrect voltage to the semiconductor die can cause damage to the circuits therein.

A second problem that may present itself is illustrated in FIG. 1A through FIG. 1C. When facing surfaces of the semiconductor device 100 and the contactor board 200 are not substantially parallel, then at least a portion of electrically conductive elements 110 may not be in contact with the corresponding electrically conductive elements 210. This lack of electrical contact can result in spurious operation.

Consequently, a need has been felt for an apparatus and an associated method for determining the relative orientation between a semiconductor device and a contactor board, each having an array of electrically conductive elements. It would be yet another feature of the apparatus and associated method to provide a technique for verifying the proper electrical conductivity between the array of electrically conductive elements of the semiconductor device and the array of electrically conductive elements of the contactor board.

It is a more particular feature of the present invention to have embedded electrically conductive elements in the semiconductor device and the contactor board such that, when the array of electrically conductive elements on the semiconductor device and the array of electrically conductive elements on the contactor board are in physical contact, a complete electrical circuit is completed. It would be yet a more particular feature of the present invention to provide a technique by which a simple electrical measurement can verify a predetermined relative orientation between a semiconductor device and a contactor board and the electrical conductivity between the arrays of electrical elements.

SUMMARY OF THE INVENTION

The aforementioned and other features are accomplished, according to the present invention, by providing a semiconductor device and a contactor board wherein the semiconductor device includes at least one designated electrically conductive path, such that, when the semiconductor device and the contactor board are mounted together in a predetermined proper orientation, verification may be obtained that a complete electrical circuit is formed. The contactor board may include at least two electrically conductive paths such that a point on each path may be contacted to ensure a completed electrical circuit between the contactor board and the semiconductor device. Each electrically conductive path may be coupled to allow external electrically conductive leads to easily verify the completed electrical circuit.

Area-array semiconductor packages may comprise a number of electrically conductive lands on an exposed face of a packaged semiconductor device, and this number of lands may be custom-designed. Often, the number of lands exceeds the number of signals on a semiconductor die such that greater routing flexibility and/or electrical isolation of "noisy" signals may be achieved. These excess "no-connect" lands may be dedicated for use with the present invention, although it will be understood that certain embodiments of the present invention may also utilize lands which are assigned to a signal. Other features and advantages of the present invention will be more clearly understood upon reading of the following description along with the accompanying figures and claims.

BRIEF DESCRIPTION OF THE DRAWINGS

FIGS. 3A, 3B, 3C and 3D illustrate bottom plan views of the semiconductor device rotated relative to the contactor board for a first embodiment of the present invention.

FIGS. 4A, 4B, 4C and 4D illustrate bottom plan views of the semiconductor device rotated relative to the contactor board for a second embodiment of the present invention.

FIGS. 8A and 8B illustrate cross-sectional views of the semiconductor devices and the contactor boards, respectively separated and in contact, illustrating a second implementation of the present invention.

DESCRIPTION OF THE PREFERRED EMBODIMENT

1. Detailed Description of the Drawings

FIGS. 1A-1C and FIG. 2 have been discussed with respect to the related art.

Figure 1:
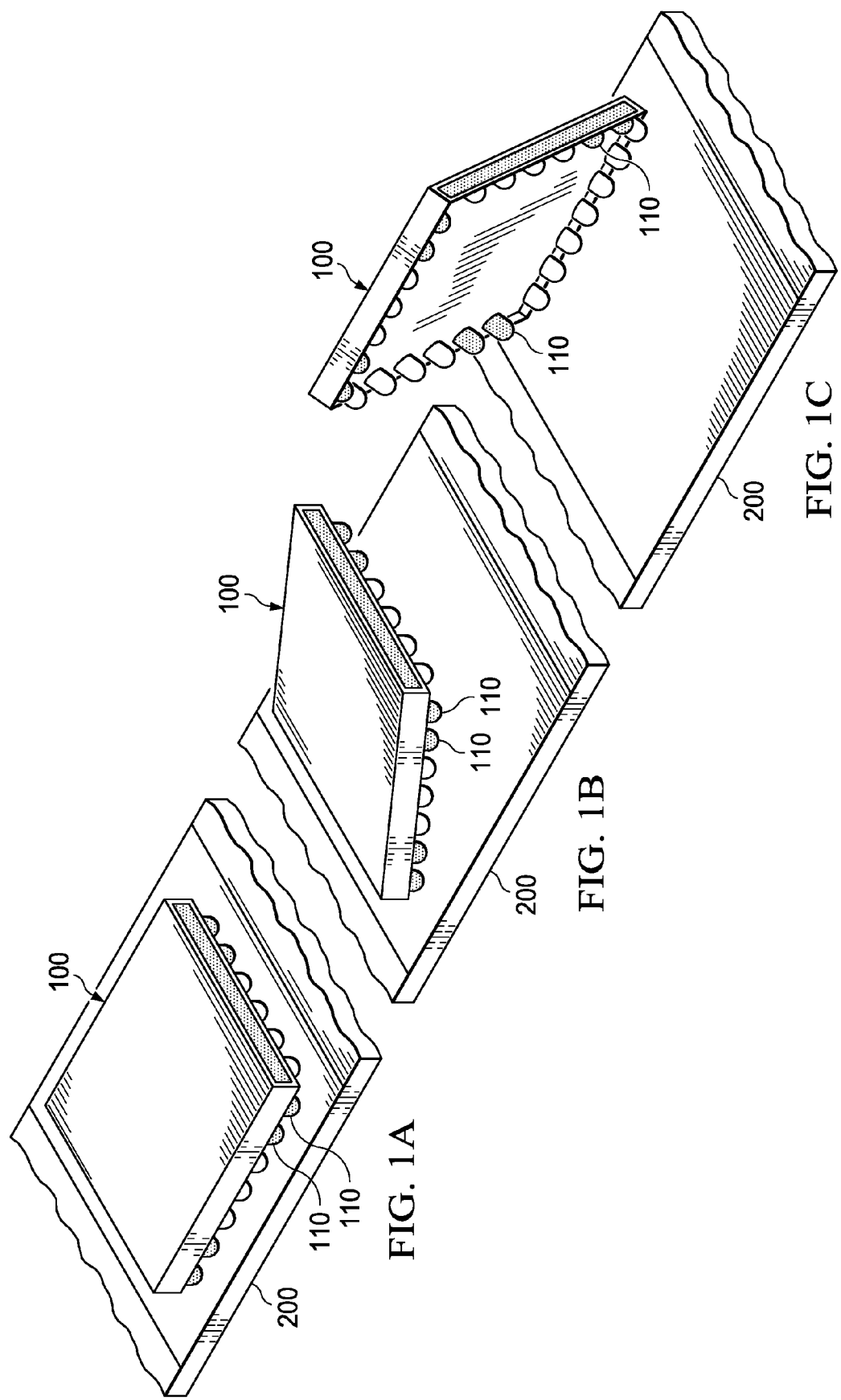
FIG. 1A illustrates a perspective view of a semiconductor device aligned with a contactor board.
FIG. 1B and FIG. 1C illustrate perspective views of two non-aligned semiconductor device and contactor board configurations.
Figure 2:
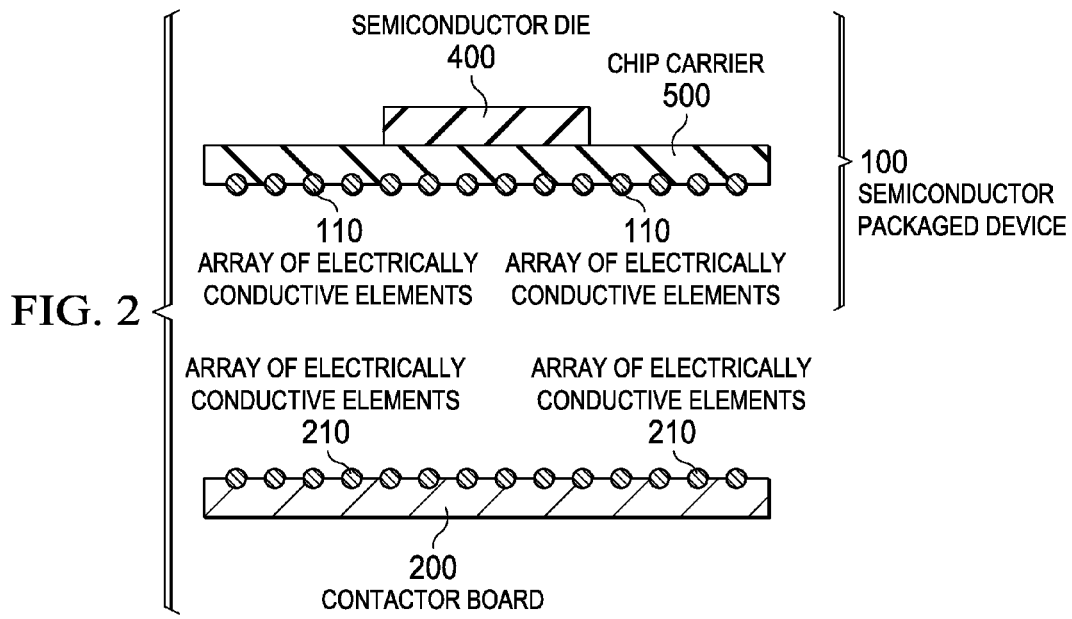
FIG. 2 illustrates a cross-sectional view of a contactor board and a semiconductor device comprising an array of electrically conductive elements and associated structures.
Figure 3A:
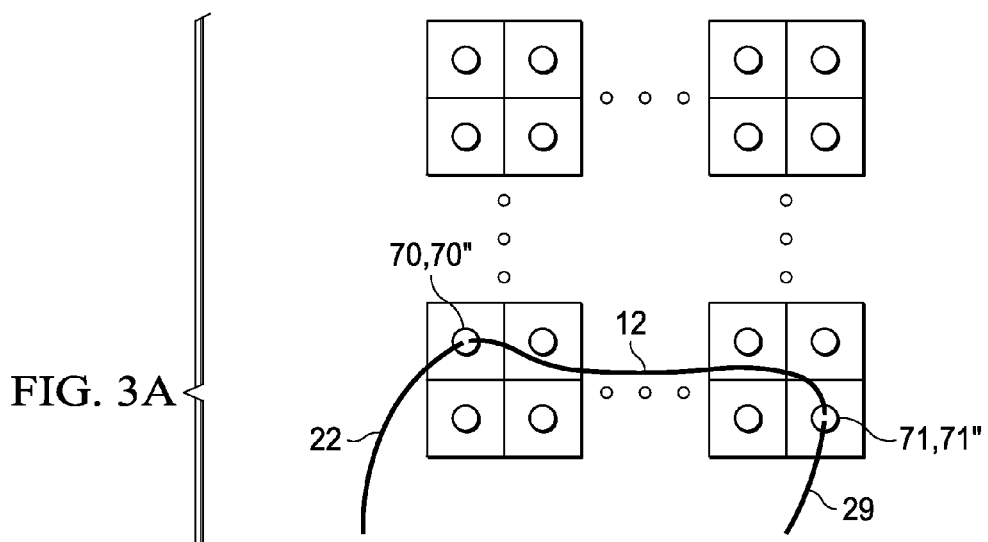
Figure 3D:
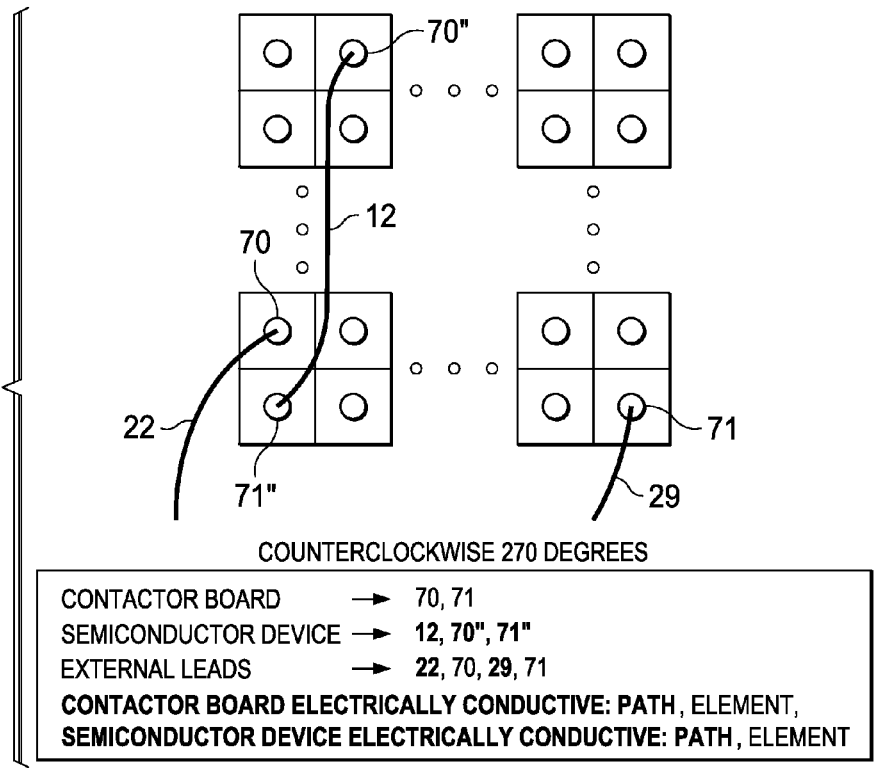

Referring next to FIG. 3A through FIG. 3D, a first embodiment of the present invention illustrates the effect on an electrically conductive path 12 formed by a electrically conductive element 70" and 70" in a semiconductor device 1 by rotation of the semiconductor device relative to a contactor board 2. In FIGS. 3A-3D, each of the four corners of the contactor board 2 are shown. The four corners of the semiconductor device 1 may be masked by the contactor board 2. The electrically conductive leads 22 and 29 generally provide external electrical access to the contactor board 2 so that a complete electrical circuit can be verified. The electrically conductive path 12, shown with a dotted line, may be fabricated within the semiconductor device 1. As the semiconductor device 1 is rotated relative to the contactor board, by 90° in FIG. 3B, by 180° in FIG. 3C and by 270° in FIG. 3D from the orientation in FIG. 1A, the electrically conductive path 12 in FIGS. 3A-3D also rotates. Only in FIG. 3A is a continuous electrically conductive path formed by the external electrically conductive leads 22 and 29, the electrically conductive path 12 and the electrical contact of the electrically conductive elements on the semiconductor device 1 and the contactor board 2. As the semiconductor device 1 is rotated relative to the contactor board 2 in FIG. 3B, FIG. 3C, and FIG. 3E, the electrically conductive path 12 between the external electrically conductive leads 22 and 29 is broken. Therefore, when an electrically conductive path is present between the external electrically conductive leads 22 and 29, the semiconductor device 1 has the orientation shown in FIG. 3A with respect to contactor board 2.

Figure 4A:
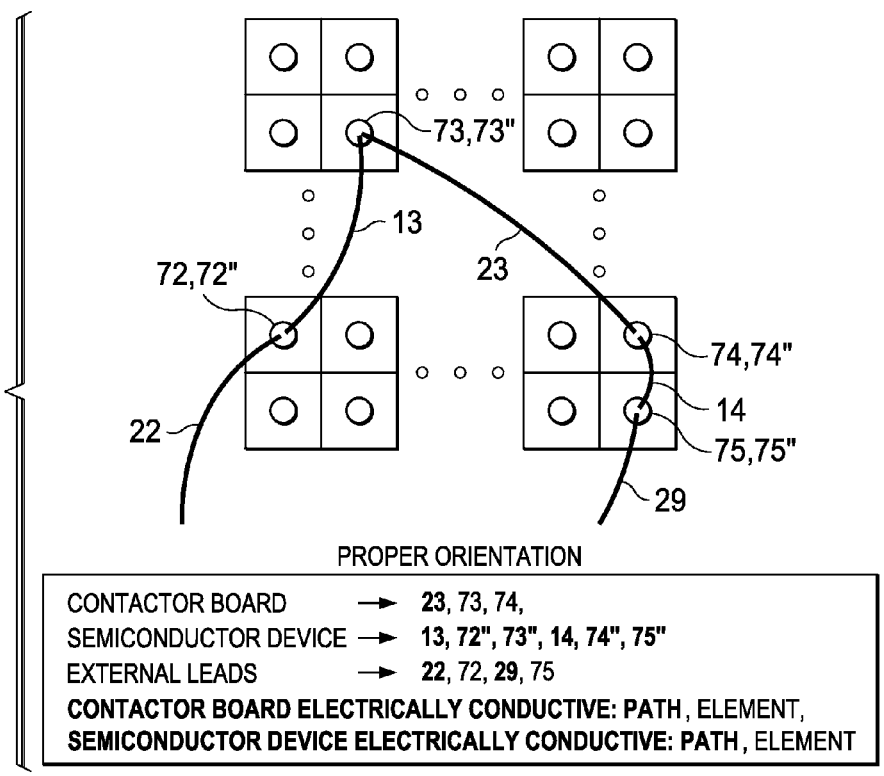
Figure 4D:
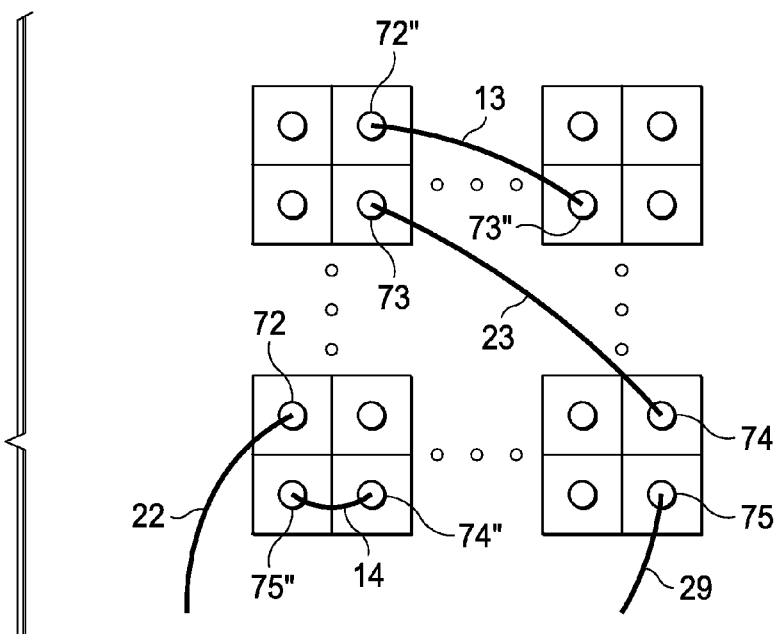

Referring to FIG. 4A through FIG. 4D, a second embodiment of the present invention illustrates the effect of orientation between the semiconductor device 1 and the contactor board 2 on an electrically conductive path 23. In FIG. 4A, the electrically conductive path between external electrically conductive leads 22 and 29 comprises the electrically conductive path 23, typically fabricated on the contactor board 2, and the electrically conductive paths 13 and 14, typically fabricated on the semiconductor device 1. Electrical coupling between the electrically conductive path 23 on the contactor board 2 and the electrically conductive paths 13 and 14 on the semiconductor device 1 may be provided by physical contact between the electrically conductive elements 74 and 73 on the contactor board 2 and the conductive elements 73" and 74" on the semiconductor device 1. Expressed in another way, when electrically conductive elements 72, 73, 74, and 75 on the contactor board are in contact with electrically conductive elements 72", 73" 74' and 75' respectively, a continuous electrically conductive path including electrically conductive paths 22, 13, 23, 14, and 29 is formed only when the contactor board 2 and the semiconductor device 1 are aligned. As illustrated in FIGS. 4B, 4C and 4D, when the orientation between the semiconductor device 1 and the contactor board 2 is not in the preferred orientation, the continuous electrically conductive path between leads 22 and 29 is not present.

Figure 5A:
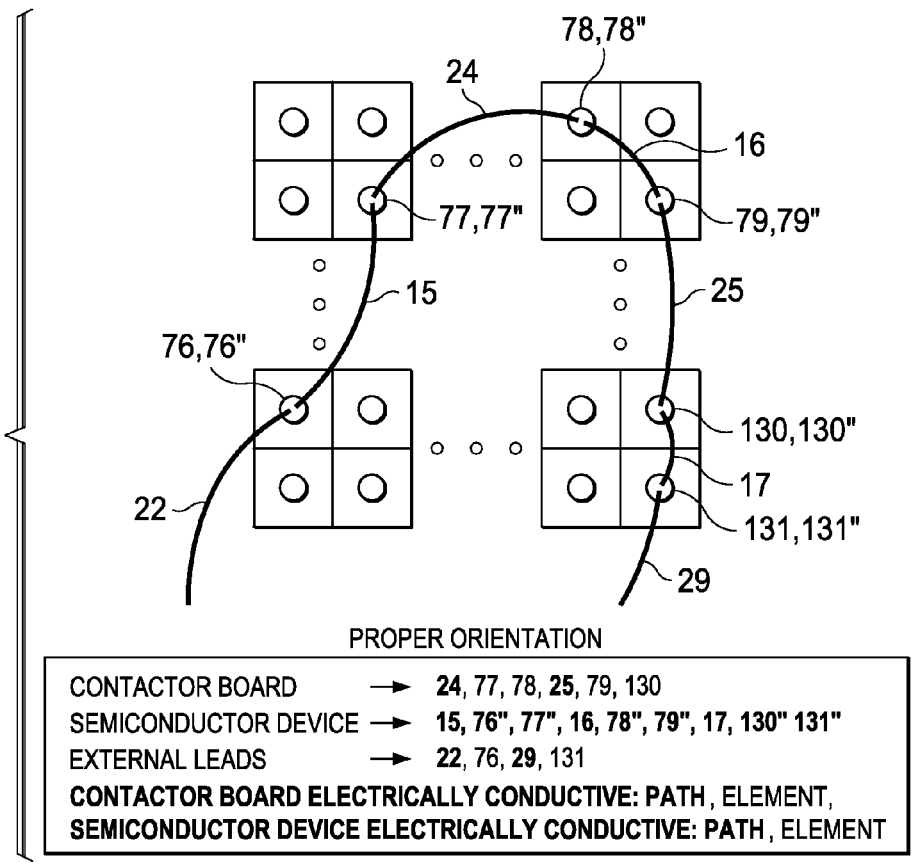
FIGS. 5A, 5B, 5C and 5D illustrate bottom plan views of the semiconductor device rotated relative to the contactor board for a third embodiment of the present invention.
Figure 5B:
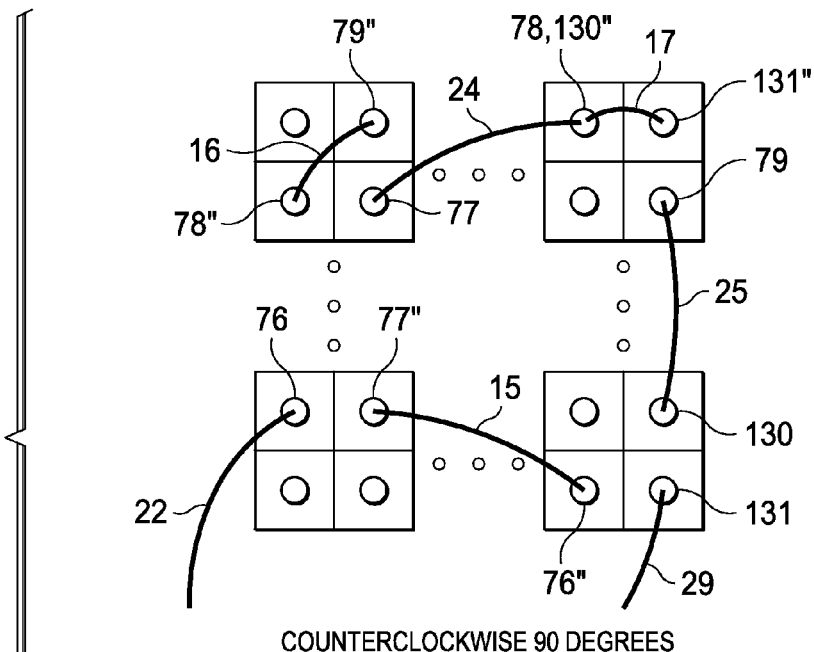
Figure 5C:
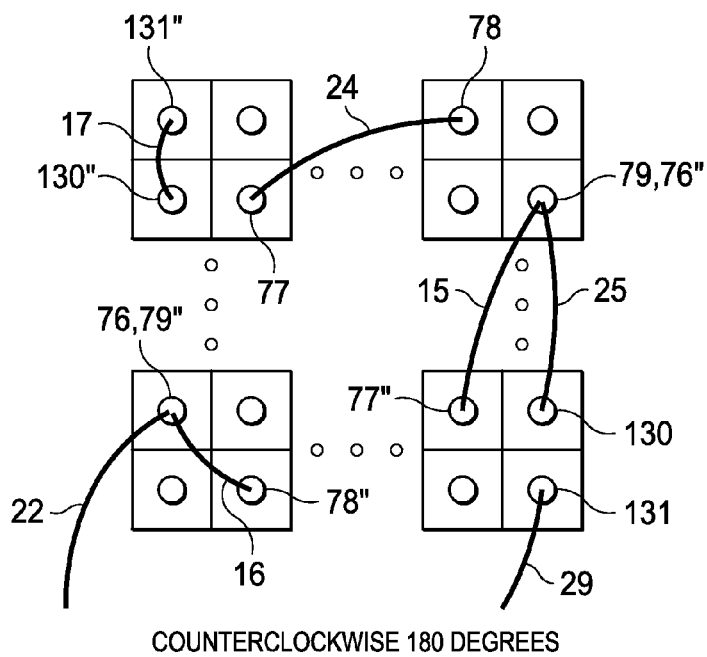
Figure 5D:
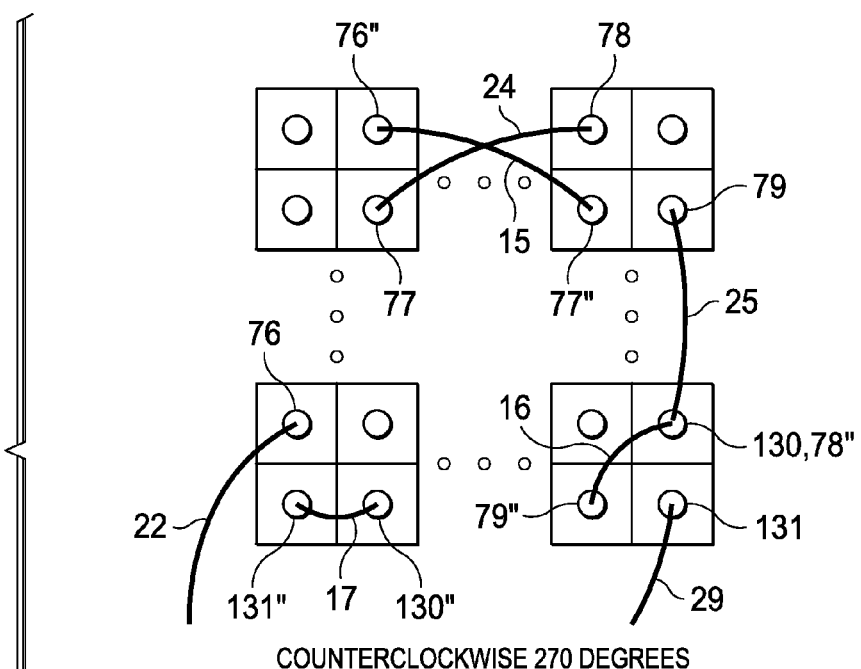
Figure 6A:
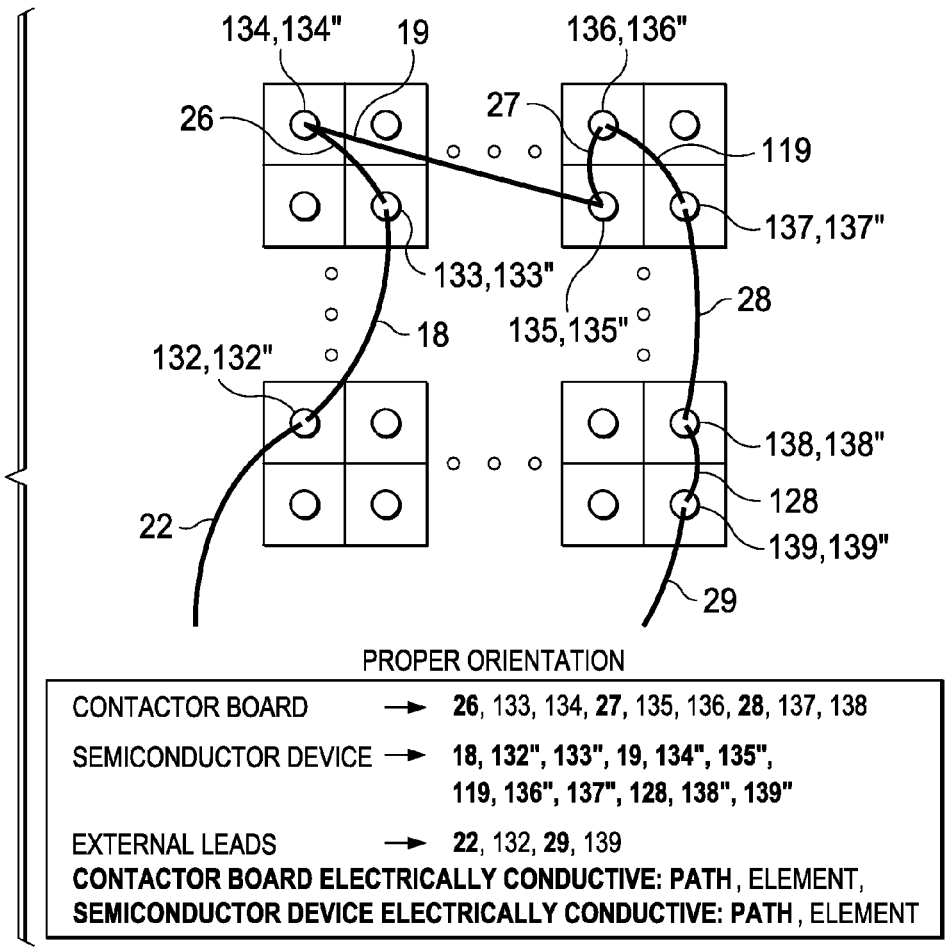
FIGS. 6A, 6B, 6C and 6D illustrate bottom plan views of the semiconductor device rotated relative to the contactor board for a fourth embodiment of the present invention.
Figure 6B:
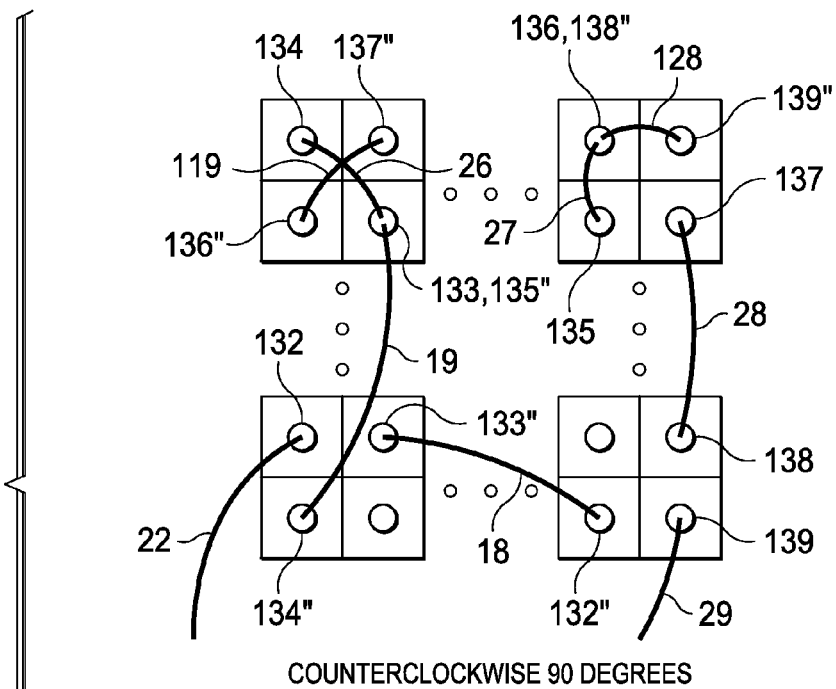
Figure 6C:
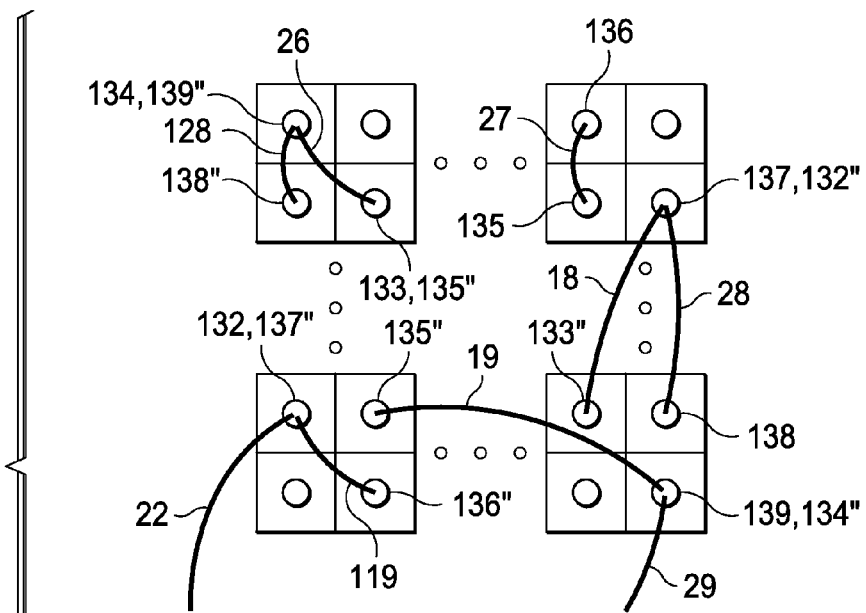
Figure 6D:
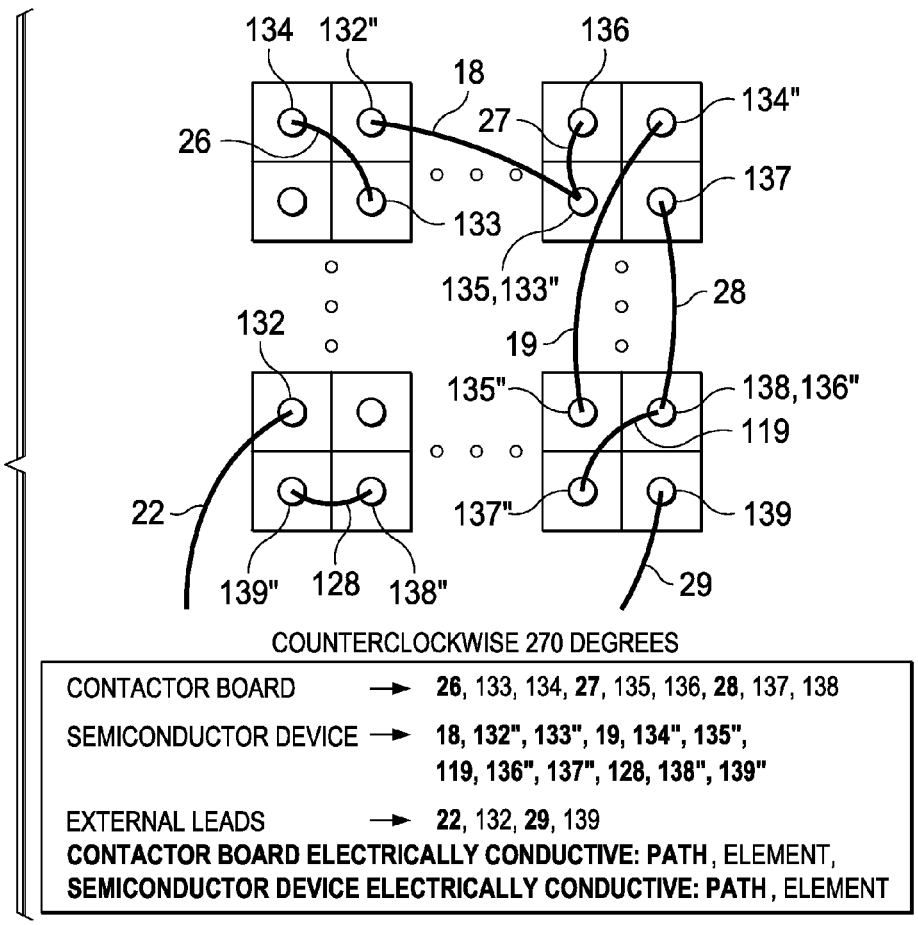

Referring to FIG. 5A through FIG. 5D, a third embodiment of the present invention illustrates a single orientation that determines when a electrically conductive path between leads 22 and 29 exists. In FIG. 5A, an electrically conductive path formed between external electrically conductive leads 22 and 29 comprises an electrically conductive path 15 formed in the semiconductor device 1, an electrically conductive path 24 formed in the contactor board 2, an electrically conductive path 16 formed in the semiconductor device 1, an electrically conductive path 25 formed in the contactor board 2 and an electrically conductive path 17 formed in the semiconductor device 1. The components of the electrically conductive path are coupled by electrical contact between electrically conductive elements 76, 77, 78, 79, 130 and 131 on the contactor board 2 and electrically conductive elements 76", 77", 78", 79", 130", and 131" respectively, on semiconductor device 1. While in FIG. 5A the electrically conductive path described above is formed between the external electrically conductive leads 22 and 29, as the relative orientation of the semiconductor device is changed in FIG. 5B, FIG. 5C, and FIG. 5D, the continuous electrically conductive path is no longer present.

Referring to FIGS. 6A through 6D, a fourth embodiment of the present invention is illustrated. The electrically conductive path from the external electrically conductive lead 22 on the left side of FIG. 6A, continues through the electrically conductive path 18 formed in the semiconductor device 1, through the electrically conductive path 26 formed in contactor board 2, through the electrically conductive path 19 formed in semiconductor device 1, through the electrically conductive path 27 formed in contactor board 2, through the electrically conductive path 119 formed in semiconductor device 1, though the electrically conductive path 28 formed in contactor board 2, through the electrically conductive path 118 formed in semiconductor device 1, and through the external electrically conductive lead 29 on the right side of FIG. 6A. The electrically conductive paths between the semiconductor device 1 and the contactor board 2 are provided by the physical contact of complimentary electrically conductive elements 132, 133, 134, 135, 136, 137, 138, 139 on the contactor board 2 and the electrically conducting elements 132", 133", 134", 135", 136", 137", 138", and 139" on the semiconductor device 1. With the other three orientations of semiconductor device 1 relative to contactor board 2 shown in FIG. 6B, FIG. 6C and FIG. 6D, no continuous electrically conductive path between the external electrically conductive leads 22 and 29 is formed. Only the proper relative orientation between the semiconductor device 1 and the contactor board 2 provides a continuous electrically conductive path.

Figure 7A:
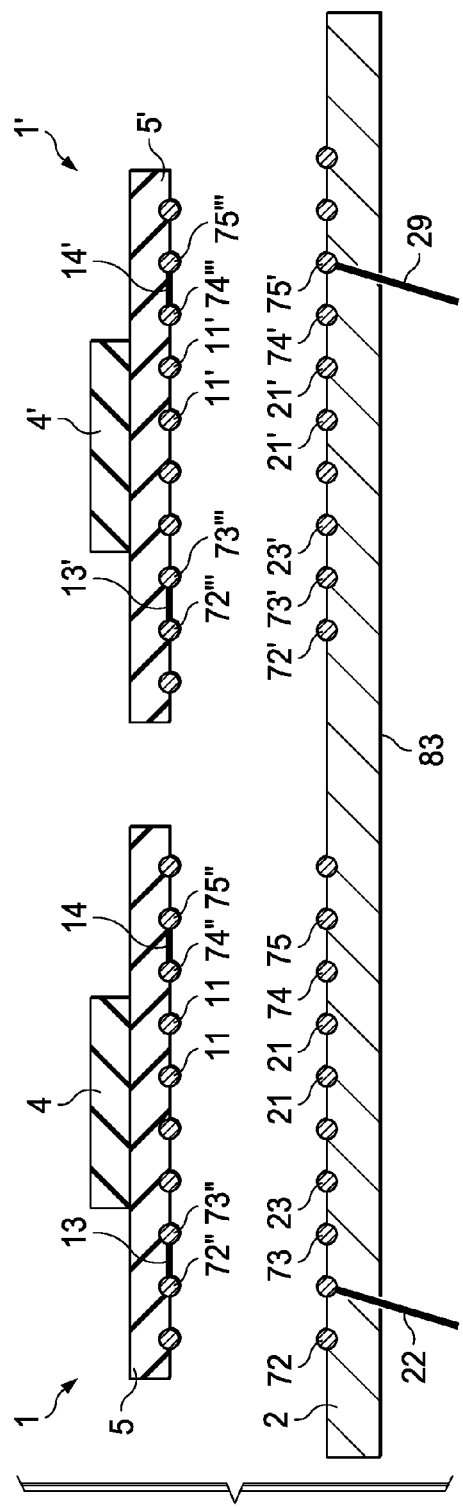
FIGS. 7A and 7B illustrate cross-sectional views of the semiconductor devices and the contactor boards, respectively separated and in contact, illustrating a first implementation of the present invention.
Figure 7B:
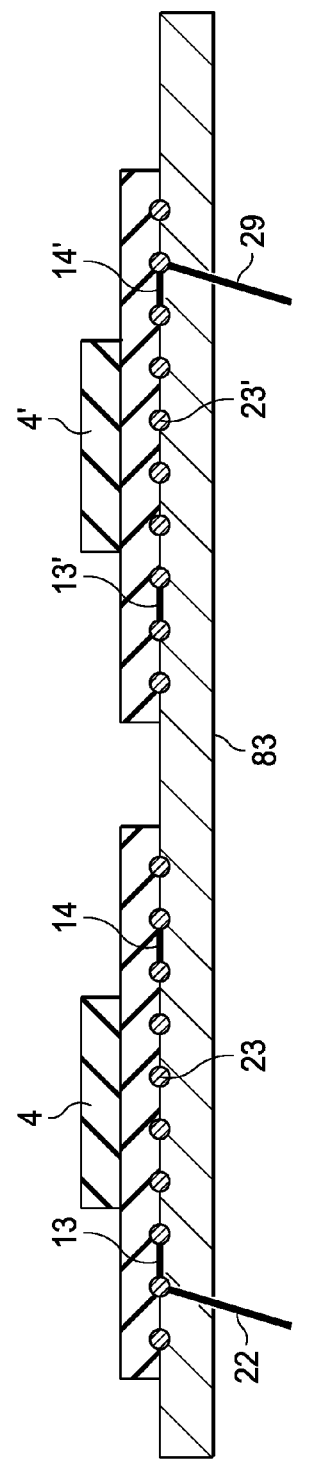

Referring to FIG. 7A and FIG. 7B, a first implementation of embodiments of the present invention shown in FIG. 3A-FIG. 3D, through FIG. 6A-FIG. 6D is illustrated. In fact, the embodiments of the invention are described with respect to those Figures are in terms of this first implementation. In FIG. 7A semiconductor device 1 and 1' each have a semiconductor die 4 and 4', respectively mounted on a chip carrier 5 and 5', respectively and having exposed electrically conductive elements 11 and 11' respectively. Separated from the semiconductor device 11 and 11' respectively is a contactor board with external electrically conductive lead 22 which is coupled to electrically conductive elements 72" associated with semiconductor device 1, and electrically conductive elements 72 associated with the contactor board 2; while external lead 29 is coupled through electrically conductive element 75'" to semiconductor device 1' and the electrically conductive element 75' to the contactor board 2. The semiconductor devices 1 and 1' are coupled by electrically conductive path 83 in the contactor board 2. The electrically conductive path 83 is coupled to the semiconductor device 1 through contacting electrically conductive elements 75 and 72' and to semiconductor device 1' through contacting electrically conductive elements 75" and 72'". The semiconductor device 1 and 1' have electrically conductive paths 13, 14 and 13', 14' formed therein. The electrically conductive elements 21 and 21', associated with the contactor board 2 contact the corresponding electrically conductive elements 11 and 11' on the semiconductor device 1 and 1'. The combination of electrically conductive paths 23 in the contactor board 2 along with the electrically conductive paths 13, 14 and 13', 14' in the semiconductor device 1 and 1' and the physical and electrical contact of the electrically conductive elements are described in detail with respect to FIG. 4A-FIG. 4D. One other feature of this implementation is that by providing an electrically conductive path 83 in the contactor board 2 from semiconductor device 1 to semiconductor device 1', the two semiconductor devices can be coupled in series. Consequently, the orientations for a plurality of semiconductor devices can be tested simultaneously. Referring to FIG. 7B, the electrically conductive elements of the semiconductor device 1 and 1' are placed in physical and electrical contact with the electrically conductive elements of the contactor board 2. When the semiconductor devices are properly oriented with respect to the contactor board 2, a continuous electrically conductive path will be formed between the two external electrically conductive leads 22 and 29. The electrically conductive path through a plurality semiconductor devices 1 and 1' will test the electrical conductivity of the semiconductor device properly mounted on the contactor board 2.

Referring to FIG. 8A and FIG. 8B, a second implementation of the use of electrically conductive paths to confirm the orientation of a semiconductor device 1 relative to a contactor board 2 is shown. In order to simplify the description, note that electrically conductive path such as 12 in semiconductor device 1 (cf. FIGS. 3A-3D) provides an electrically conductive path between two electrically conductive elements. The electrically conductive path 12 is formed in the semiconductor device 1 in FIGS. 3A-3D. In FIG. 8A and FIG. 8B, an electrically conductive path such as 12 is replaced by a electrically conductive path 82. A bond wire is used to provide the electrically conductive path 82 between the electrically conductive elements through the semiconductor device 1. As will be clear, any electrically conductive path formed in the semiconductor device, as described with respect to FIG. 7A and FIG. 7B can be replaced by the bond wire implementation shown in FIG. 8A and FIG. 8B. As with the implementation of the semiconductor device on the contactor board 2 described with respect to FIG. 7A and FIG. 7B, the orientation of an arbitrary number of semiconductor devices can be ascertained.

Figure 9A:
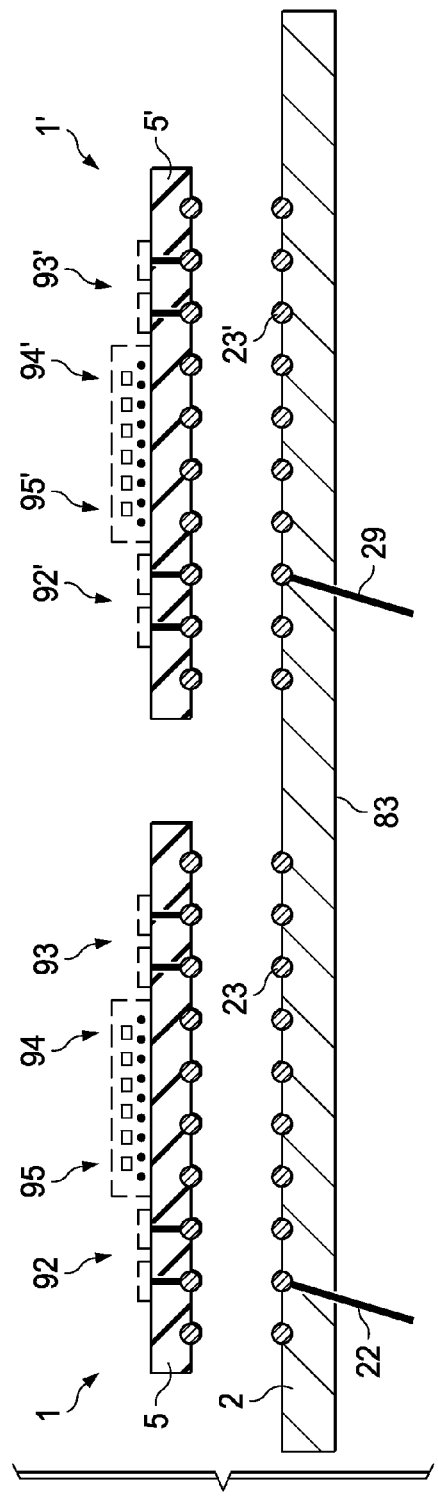
FIGS. 9A and 9B illustrate cross-sectional views of the semiconductor devices and the contactor boards, respectively separated and in contact, illustrating a third implementation of the present invention.
Figure 9B:
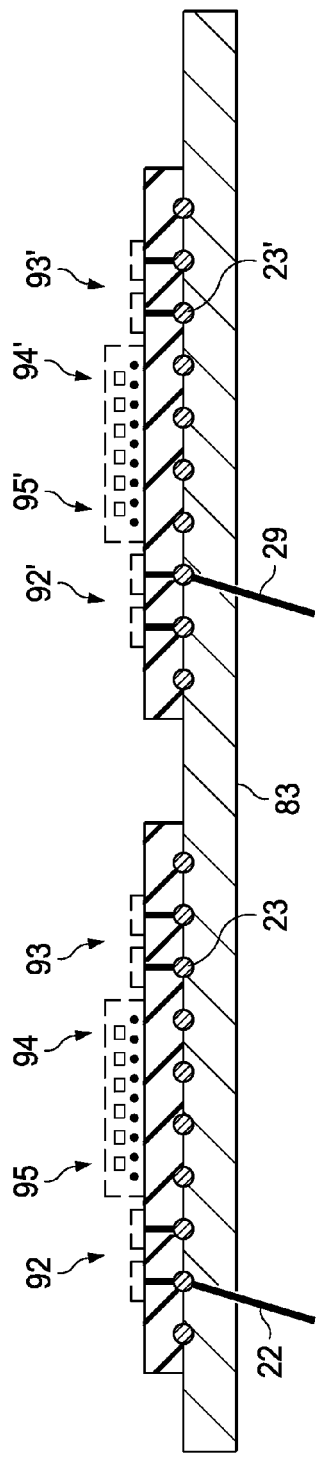

Referring to FIG. 9A and FIG. 9B, another implementation is shown of the electrically conductive path through the semiconductor device 1 and the contactor board 2 is illustrated. In this implementation, use is made of the fact that a plurality of electrically conductive elements coupled to the semiconductor die is at the same potential, i.e., short circuited. Specifically, the core power supply may have several electrically conductive leads to the semiconductor die. For example, one semiconductor device that was tested had 21 electrically conductive leads for application of the core power supply to their semiconductor chip. Because of the presence of short-circuited leads coupled to the semiconductor chip, these electrically conductive leads can be used to form part of the electrically conductive path associated with the semiconductor device 1, 1' between external electrically conductive leads 22 and 29. In FIG. 9A, where the semiconductor device 1 and 1' and the contactor board 2 are separated, and in FIG. 9B, where the electrically conductive elements of semiconductor device 1, 1' and the contactor board 2 are in contact, electrically conductive paths 92, 93, 94, 95, 92' 93' 94' and 95', are formed by bond wires and bondfingers between the electrically conductive elements in the semiconductor device 1 and 1' and electrically conductive elements of the semiconductor die 4 and 4'. In this manner, the orientation and electrical conductivity of the semiconductor device and the contactor board can be ascertained.

2. Operation of the Preferred Embodiment

According to the present invention, the aforementioned and other features are accomplished by providing a semiconductor device, which may be a packaged semiconductor device comprising a semiconductor die in electrical contact with a chip carrier such as a package substrate or tape, and a contactor board, wherein the semiconductor device includes at least one electrically conductive path, such that when the semiconductor device and the contactor board are mounted together in proper orientation, a complete electrical circuit is formed. The contactor board may include at least two electrically conductive paths such that each path may be contacted to ensure a completed electrical circuit between the contactor board and the semiconductor device.

In a preferred embodiment, the electrically conductive path within the semiconductor device may comprise an electrically conductive metal trace embedded in an exposed face of the semiconductor device. Each trace may comprise at least two electrically conductive terminating points, each of which may be a solder ball, package terminal or an electrically conductive land or pad for contacting a facing electrically conductive element, which preferably may be an exposed electrically conductive pad on the contactor board.

The conductive elements on the contactor board may be electrically coupled to electrically conductive paths, which when probed or measured, can indicate whether proper orientation and electrical conductivity has been achieved between the semiconductor device and the contactor board. It will be understood that this particular embodiment of the present invention may require no electrical conductivity with the semiconductor die.

The semiconductor device may include more than one pair of electrically conductive paths such that improper orientation of the semiconductor device relative to the contactor board can be more easily detected. This result can be particularly critical on semiconductor devices with a higher quantity of package terminals or a larger body size, as larger body sizes can be more prone to warpage or issues maintaining proper orientation across the package body with respect to the contactor board, as any degree of tilt may become magnified across a larger body size. Preferably, at least two pairs of package terminals may be designated for use with this invention, each pair coupled by its own embedded trace. Such pairs may be located anywhere on an exposed face of the semiconductor device such that they do not provide a completed electrical circuit between the semiconductor device and the contactor board should the semiconductor device be improperly oriented on the contactor board.

In another embodiment of the present invention, the electrically conductive paths within the semiconductor device may be formed by at least one electrically conductive bond wire between a pair of bondfingers or other electrically conductive lands located within the semiconductor device. Bondfingers and other such lands located within the semiconductor device may typically be located on a unexposed area of the device, such as the unexposed face of the chip carrier.

In this embodiment, the electrically conductive lands may be situated within a packaged semiconductor device and utilize electrically conductive traces within the semiconductor device, such as vias or traces running through the chip carrier, to achieve electrical contact with the exposed face of the semiconductor device, which in turn can be used to form an electrical circuit with the contactor board. The embodiment may preferably include at least two bond wires, each connecting a pair of bondfingers, with each pair of bondfingers in electrical contact with a pair of package terminals on the packaged semiconductor device. Conductive elements on the contactor board designed for contact with these package terminals may be electrically coupled to electrically conductive paths, that when probed or measured, can indicate whether proper orientation and electrical conductivity has been achieved between the semiconductor device and the contactor board.

In another embodiment of the present invention, a direct electrical connection is designed to exist in a semiconductor die between at least one pair of signals on the die, which can be located within a semiconductor device. This direct electrical connection implies that each pair of signals shares a distinctive function such that they are virtually indistinguishable electrically from one another.

Each signal may be in the form of a bond pad, each bond pad designed for electrical connection to a chip carrier, the means of which may be a bond wire, flip chip bump or other electrically conductive means for coupling a bond pad to the chip carrier. The chip carrier may then comprise embedded electrical paths, typically in the form of traces, for electrically coupling the semiconductor die to an array of electrically conductive elements on the exposed face of the semiconductor device. Each trace may comprise at least two electrically conductive terminating points, each of which may be a solder ball, package terminal or an electrically conductive land for contacting a facing electrically conductive element on the contactor board.

The conductive elements on the contactor board may be electrically coupled to electrically conductive paths, which when probed or measured, may indicate whether proper orientation and electrical conductivity has been achieved between the semiconductor device and the contactor board.

In yet another embodiment of the present invention, at least two semiconductor devices may be tested concurrently by forming a daisy chain, or a continuous electrical path between the semiconductor devices, each coupled to a contactor board. The contactor board may comprise at least two terminating electrically conductive paths that when probed or measured, may indicate whether proper orientation and electrical conductivity has been achieved between the semiconductor device and the contactor board. When all semiconductor devices mounted to the contactor board are properly oriented, a completed electrical circuit is formed between the two terminating electrically conductive paths and passing through each semiconductor device.

As indicated in FIGS. 3A-3D, a continuous electrically conductive path is only established for FIG. 3A. This result permits the determination of when the semiconductor device and the contactor board have the proper relative orientation. From a procedural point of view, it is only necessary to form the continuous electrically conductive path and apply an ohmmeter to the external electrically conductive leads. With the proper orientation between the semiconductor device and the contactor board, an ohmmeter will show a low resistance value. For any relative orientation that is not the predetermined relative orientation, the ohmmeter will show an open electrical circuit. Consequently, the present invention provides an effective method demonstrating that a predetermined relative orientation between the semiconductor device and the contactor board is present.

As indicated above, in the preferred embodiment, the embedded electrically conductive paths in the semiconductor device are located between external electrically conductive leads near the corners of the electrically conductive array of elements. The positioning of these embedded electrically conductive elements provide a method for demonstrating that, in the presence of the proper orientation between a semiconductor device and a contactor board, the electrical conductivity between the semiconductor device and the contactor board is verified. By verifying the electrical conductivity between the semiconductor device and the contactor board at the four corners, confidence is gained that electrical conductivity between all electrically conductive elements on the semiconductor device and the contactor board is present.

A number of restrictions are present with regard to use of electrically conductive paths through a semiconductor die as shown in FIG. 9A and FIG. 9B. First, the number of electrical connections to semiconductor die at the same potential can provide confusion when orientation is tested. Second, when several electrically conductive elements are the same potential, the coupling between electrically conductive elements may be performed by an electrically conductive plate within the semiconductor die. Once again, the electrically conductive plate confuses the identity of the bond wires and semiconductor die elements, making the use of this technique for the testing of more than two semiconductor devices inappropriate. In general, only two semiconductor devices can be tested at a time with this technique. If the numbers of independent electrically conductive paths through the semiconductor die are equal to or greater than the number of electrically conductive paths in the semiconductor device itself, then any number of semiconductor devices can simultaneously be tested for orientation and electrically conductivity for any of the embodiments of the present invention.

While the present invention has been described with respect to the embodiments set forth above, the invention is not necessarily limited to these embodiments. Accordingly, other embodiments, variations and improvements not described herein are not necessarily excluded from the scope of the invention, the scope of the invention being defined by the following claims.

What is claimed is:

1. A configuration of electrically conductive paths for identifying an orientation and an electrical conductivity between a packaged semiconductor device and a contactor board, the configuration comprising:
    electrically conductive elements on the semiconductor device;
    at least one electrically conductive path on the semiconductor device, the ends of the electrically conductive path electrically coupled to predetermined electrically conductive elements on the semiconductor device;
    electrically conductive elements on the contactor board; and
    two external electrically conductive leads electrically coupled to preselected conducting elements on the contactor board;
    wherein a continuous electrically conductive path is formed between the external electrically conductive leads only when the predetermined electrically conductive elements on the semiconductor device and the preselected electrically conductive elements on the contactor board are in physical contact.

2. The configuration as recited in claim 1 wherein the continuous electrically conductive path is formed only when the semiconductor device and the contactor board have a predetermined relative orientation.

3. The configuration as recited in claim 2 wherein the preselected electrically conductive elements are located in the corners of an array of electrically conductive elements.

4. The configuration as recited in claim 3 wherein the semiconductor device has a plurality of electrically conductive paths and the contactor board has at least one electrically conductive path, the electrically conductive paths on the semiconductor device and the contactor board electrically coupled by electrically conductive paths on the semiconductor device and on the contactor board.

5. The configuration as recited in claim 4 wherein a least one electrically conductive path on the semiconductor device includes an electrically conductive path formed by a bond wire between two bondfingers.

6. The configuration as recited in claim 4 wherein a portion of one electrically conductive path associated with the semiconductor device includes an electrically conductive path through the semiconductor die.

7. The configuration as recited in claim 4 wherein the orientation can be determined for a plurality of semiconductor devices.

8. A method of determining an orientation of a semiconductor device relative to a contactor board, the method comprising;
    forming an electrically conductive path on the semiconductor device; and
    using electrically conductive elements in contact, coupling the electrically conductive path to preselected electrically conductive elements on the contactor board;
    selecting the preselected electrically conductive elements from electrically conductive elements proximate the corner of an array of electrically conductive elements;
    forming at least one additional electrically conductive path in the semiconductor device;
    forming at least one electrically conductive path in the contactor board; connecting the electrically conductive paths in the semiconductor device and in the contactor board with electrically conductive elements to form a continuous electrically conductive path only when the semiconductor device and the contactor board have a predetermined relative orientation the continuous electrically conductive path terminating in the preselected electrically conductive elements.

9. The method as recited in claim 8 comprising implementing at least one electrically conductive path in the semiconductor device by a bond wire coupled to bondfingers.

10. The method as recited in claim 8 comprising implementing a portion of the continuous electrically conductive path associated with the semiconductor device by an electrically conductive path through a semiconductor die.

11. The method as recited in claim 8 further comprising coupling external leads to the preselected electrically conductive elements.

* * * * *